United States Patent
Braun et al.

(10) Patent No.: US 6,759,874 B2
(45) Date of Patent: Jul. 6, 2004

(54) ELECTRONIC CIRCUIT WITH A DRIVER CIRCUIT

(75) Inventors: Georg Braun, Holzkirchen (DE); Helmut Kandolf, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/253,001

(22) Filed: Sep. 23, 2002

(65) Prior Publication Data

US 2003/0057994 A1 Mar. 27, 2003

(30) Foreign Application Priority Data

Sep. 21, 2001 (DE) .......................................... 101 46 491

(51) Int. Cl.[7] ..................... H03K 19/094; H03K 19/003
(52) U.S. Cl. ............................ 326/87; 326/30; 327/108
(58) Field of Search .............................. 326/86–87, 83, 326/30, 56–58; 327/108–109

(56) References Cited

U.S. PATENT DOCUMENTS 5,602,494 A * 2/1997 Sundstrom ................... 326/39
5,841,702 A * 11/1998 Kim ....................... 365/189.05
6,501,293 B2 * 12/2002 Braceras et al. .............. 326/30

* cited by examiner

Primary Examiner—James H. Cho
(74) Attorney, Agent, or Firm—Laurence A. Greenberg; Werner H. Stemer; Gregory L. Mayback

(57) ABSTRACT

An electronic circuit has a driver circuit to drive a signal onto a signal line. The driver circuit contains a first switching device with a first forward resistance between a first supply voltage terminal and the signal line, and a second switching device with a second forward resistance between a second supply voltage terminal and the signal line. A control circuit is provided to generate a first and a second control signal to control the first and second switching devices in a first operating mode such that, depending on the signal which is to be driven, either the first switching device or the second switching device is through-connected. In a second operating mode, the first switching device and the second switching device are essentially through-connected with the aid of the first and second control signals so that the first and second forward resistances together form a terminating resistance.

12 Claims, 4 Drawing Sheets

ELECTRONIC CIRCUIT WITH A DRIVER CIRCUIT

BACKGROUND OF THE INVENTION

Field of the Invention

The invention relates to an electronic circuit with a driver circuit to drive a signal onto a signal line.

In radio-frequency bus systems, reflections of signals on line ends, line divisions and the like result in unwanted overlays of the original signal with a reflected signal. The original signal is thereby amplified or attenuated. Both outcomes produce an unwanted, uncontrollable signal change. An interface which drives a signal onto a bus line or which receives the signal from the bus line is often located at one line end of a two-way bus system. When a signal is received, one unit, which normally carries out the signal drive during transmission, is switched to a passive mode. When a signal is transmitted, on the other hand, the receive component of the interface is disabled or deactivated.

Particularly when the signal is received via the bus line, the original signal may be overlaid by reflected signals occurring on an unterminated bus line end. The resulting change in the original signal may cause transfer errors.

So that essentially only the original signal is read when the signal is received, terminating resistances are provided on line ends, representing a sink for the incoming signal, whereby the incoming signal is not reflected. The terminating resistance is dimensioned in such a way that it corresponds to the characteristic line impedance.

However, the disadvantage of providing a fixed terminating resistance on a line end is that, when a signal is driven by a driver stage, some of the power of the transmitted signal is lost via the terminating resistance. It is thus necessary to increase the dimensions of the driver stage more than would be necessary without a terminating resistance.

SUMMARY OF THE INVENTION

It is accordingly an object of the invention to provide an electronic circuit with a driver circuit that overcomes the above-mentioned disadvantages of the prior art devices of this general type.

With the foregoing and other objects in view there is provided, in accordance with the invention, an electronic circuit. The electronic circuit contains a first supply voltage terminal, a second supply voltage terminal, and a driver circuit for driving a signal onto a signal line having a specific characteristic impedance. The driver circuit has a first switching device with a first forward resistance between the first supply voltage terminal and the signal line, and a second switching device with a second forward resistance between the second supply voltage terminal and the signal line. A control circuit is connected to the driver circuit and generates a first control signal and a second control signal for controlling the first switching device and the second switching device in a first operating mode such that, depending on the signal to be driven, either the first switching device or the second switching device is through-connected so that the signal will be driven onto the signal line. The control circuit activates the first switching device and the second switching device substantially simultaneously in a second operating mode with an aid of the first and second control signals so that the first and second forward resistances together form a terminating resistance.

According to the invention, the electronic circuit is provided with the driver circuit to drive the signal onto the signal line. The signal line has a specific characteristic impedance. The driver circuit contains the first switching device with a first forward resistance between a first supply voltage terminal and the signal line, and the second switching device with a second forward resistance between a second supply voltage terminal and the signal line. The control circuit is furthermore provided in order to generate the first and second control signals. In the first operating mode, the first and second switching devices are controlled by the first and second control signals in such a way that, depending on the signal which is to be driven, either the first switching device or the second switching device is through-connected so that the signal is driven onto the signal line. In the second operating mode, the first and the second switching devices are activated substantially simultaneously with the aid of the first and second control signals so that the forward resistances of the first switching device and the second switching device together form a terminating resistance.

The circuit according to the invention therefore provides that the first and second switching devices that are normally provided in order to construct a driver stage are used in order to form a terminating resistance when the driver circuit is not required, e.g. when a signal is received. As a result, on the one hand, no additional terminating resistance needs to be provided which reduces the signal power when a signal is transmitted, and, furthermore, the terminating resistance can be accurately set by dimensioning the first and second switching devices.

According to a further preferred embodiment of the invention, the first switching device has one or more parallel-connected first switching elements, to which the first control signal is in each case applied, and the second switching device has one or more parallel-connected second switching elements, to which the second control signal is in each case applied. At least some of the first switching elements can be activated in each case via one of the first selection signals, and at least some of the second switching elements can be activated in each case via one of the second selection signals. In this way, the first forward resistance can be set by the forward resistances of the first switching elements activated with the aid of the first selection signals and the second forward resistance can be set by the forward resistances of the second switching elements activated with the aid of the second selection signals.

The plurality of first and second switching elements can be enabled or disabled so that, in the second operating mode, the first and second forward resistances can be accurately set. The first forward resistance and the second forward resistance are derived from a parallel connection of the forward resistances of the switching elements activated by the selection signals. From the perspective of the incoming signal, the terminating resistance then corresponds to a parallel connection of the first and second forward resistances. The first and second selection signals can be provided in the first operating mode in such a way that the driver power of the driver circuit can thus be set. The greater the number of switching elements activated by the selection signals, the higher the driver power will generally be.

The first switching elements may in each case have a first transistor, whereby the first control signal is applied to a control input of the first transistor depending on the corresponding first selection signal. One of the second switching elements has a second transistor, whereby the second control signal is applied to a control input of the second transistor depending on the correspondingly allocated second selection signal. A first NAND circuit is preferably connected to the control input of the first transistor and a second AND circuit is preferably connected to the control input of the second transistor. The first control signal is applied to a first input of the first AND circuit and the corresponding first selection signal is applied to the second input of the AND circuit. The second control signal is applied to a first input of the second AND circuit and the correspondingly allocated second selection signal is applied to the second input of the AND circuit. The simplest possible configuration is achieved in this way for the first and second switching devices with switching elements, whereby the forward resistance is essentially formed by the forward resistances of the first and second transistors. Generally, these can also be accurately defined in an integrated process by setting process parameters.

According to a further aspect of the present invention, it can be provided that the first switching device contains a plurality of parallel-connected first transistors and a series-connected second transistor, and the second switching device contains a plurality of parallel-connected third transistors and a series-connected fourth transistor. The first control signal is applied to a control input of the second transistor and the second control signal is applied to a control input of the fourth transistor. The first selection signals are applied to the control inputs of the first transistors and the second selection signals are applied to the control inputs of the third transistors. The first forward resistance can be set by the forward resistances of the first transistors activated with the aid of the first selection signals and the second transistor, and the second forward resistance can be set by the forward resistances of the third transistors activated with the aid of the second selection signals and the fourth transistor. In this way, a driver circuit configured with the smallest possible number of transistors can be implemented, whereby the driver circuit is suitable for providing a terminating resistance for the connected bus line which can be set as accurately as possible in the second operating mode. In the first operating mode, the driver power is defined by the first and third transistors that are activated by the first selection signals and the second selection signals.

In order to achieve the best possible termination of the signal line, it can be provided that the first and second selection signals are selected in such a way that the terminating resistance corresponds to the characteristic impedance of the signal line.

It can furthermore be provided that the first selection signals and the second selection signals are selected in order to define the first forward resistance of the first switching device and the second forward resistance of the second switching device in such a way that the signal line has a predefined voltage level. The voltage level on the signal line preferably lies midway between a first voltage level on the first supply voltage terminal and a second voltage level on the second supply voltage terminal.

It can furthermore be provided that the control circuit has a data input for applying data and a termination control input in order to apply a termination control signal. In addition, the control circuit has a NAND circuit and a NOR circuit. The data signal is applied to a first input of the NOR circuit and the termination control signal is applied to the second input of the NOR circuit. The first control signal is present at the output of the NOR circuit. The data signal is applied to a first input of the NAND circuit and the termination control signal inverted via an inverter is applied to a second input of the NAND circuit. The second control signal is then present at each output of the NAND circuit. The control circuit can thus be implemented in a simple manner, whereby the changeover between the first operating mode and the second operating mode is indicated by the termination control signal. If the termination control signal indicates that the driver circuit is to be switched to passive, the first control signal and the second control signal are switched in such a way that the first switching device and the second switching device are through-connected, and their forward resistances produce the terminating resistance.

Other features which are considered as characteristic for the invention are set forth in the appended claims.

Although the invention is illustrated and described herein as embodied in an electronic circuit with a driver circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
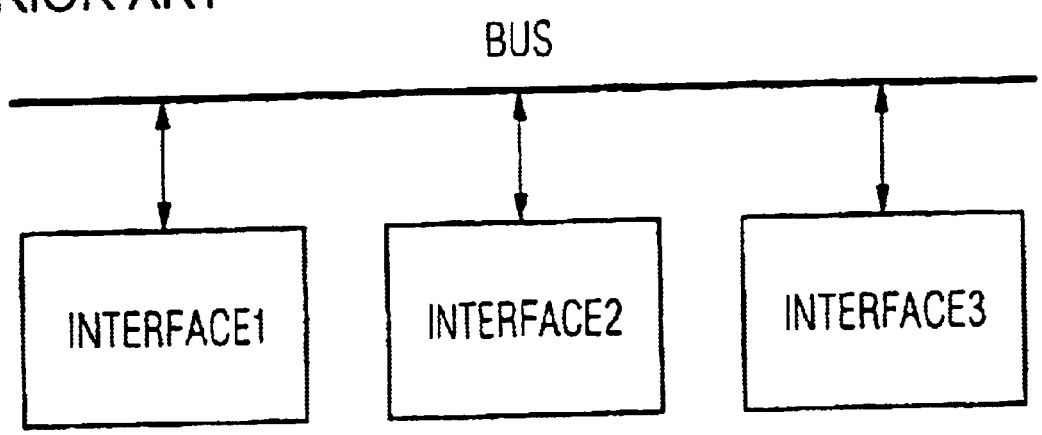
FIG. 1 is a block diagram of a bus system with a plurality of connected interfaces.

Referring now to the figures of the drawing in detail and first, particularly, to FIG. 1 thereof, there is shown a bus system with bus lines BUS. A plurality of interfaces Interface1, Interface2 and Interface3 are connected to the bus system. The interfaces are able to drive data onto the bus lines BUS and to read data from the bus lines BUS. To do this, the interfaces Interface1, Interface2 and Interface3 have driver circuits which can drive data onto the bus lines BUS and which are switched to a passive mode during periods in which no transmission takes place.

Figure 2A:
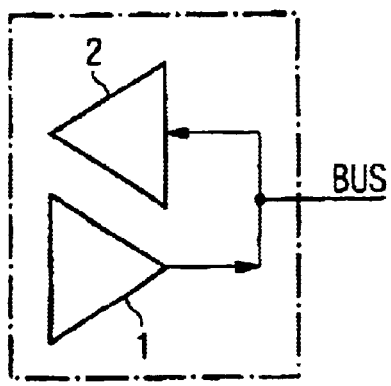
FIG. 2A is a circuit diagram of an example of an interface present on the bus system shown in FIG. 1.

FIG. 2A shows a driver circuit of this type on one of the interfaces. A driver circuit 1 is shown which is connected to one of the bus lines BUS in order to drive data onto the bus line BUS. A receiver circuit 2 is likewise connected to the bus line BUS in order to read data from the bus line BUS. While the data are being read from the bus line BUS, the driver circuit 1 must be switched to the passive mode so that the data to be read are not overlaid with transmitted data.

Figure 2B:
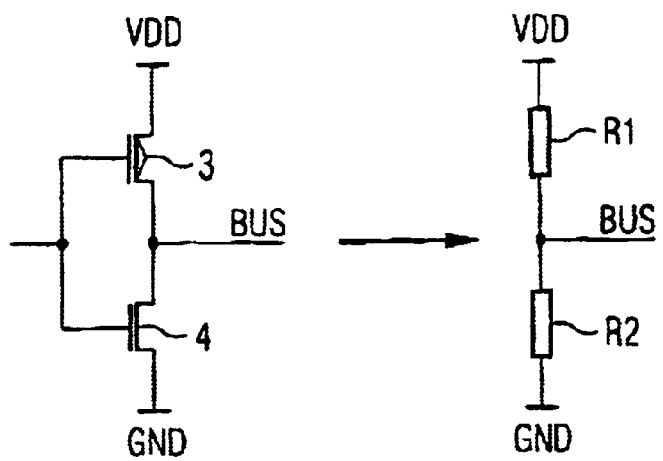
FIG. 2B is a circuit diagram of a simple driver stage and a terminating resistance formed therefrom.

FIG. 2B shows a more detailed view of the driver circuit 1. The driver circuit 1 has a first transistor 3 and a second transistor 4. The first transistor 3 and the second transistor 4 are connected in series, whereby an output of the driver circuit 1 is located on interconnected terminals of the first transistor 3 and the second transistor 4. A respective signal is applied to control inputs of the first transistor 3 and the second transistor 4 in order to drive a signal, whereby an inverted signal is present at the output. A further terminal of the first transistor 3 is connected to a first supply voltage potential VDD and a further terminal of the second transistor 4 is connected to a second supply voltage potential GND, preferably a ground potential. If the driver circuit 1 is not used to drive a signal onto the bus line BUS, the driver circuit 1 is switched to the passive mode. This can be done on the one hand by deactivating the first transistor 3 and the second transistor 4, so that neither the first supply voltage potential VDD nor the second supply voltage potential GND is applied to the bus line. However, in order to terminate the bus line with a terminating resistance $R_{TT}$ when no signal is transmitted, it can also be provided that the first transistor 3 and the second transistor 4 are simultaneously switched to a forward mode, so that a first forward resistance $R_1$ is present between the first supply voltage potential VDD and the corresponding bus line BUS, and a second forward resistance $R_2$ is present between the second supply voltage potential GND and the bus line BUS.

The first and second forward resistances form a common terminating resistance with which the bus line BUS is terminated. The common terminating resistance $R_{TT}$ is preferably selected in such a way that it corresponds to the line resistance of the bus line BUS, so that no reflections from incoming signals can occur. The terminating resistance $R_{TT}$ is determined from the following formula:

$$R_{TT} = \frac{R_1 \cdot R_2}{R_1 + R_2}$$

Through suitable dimensioning of the transistors, $R_1$ and $R_2$ can be adapted so that the terminating resistance $R_{TT}$ corresponds to the characteristic impedance of the bus line BUS, thereby creating a sink. Furthermore, the influence of the two open transistors on the voltage potential is intended to remain small. This is achieved, for example, by using transistors 3, 4 with small dimensions. It is furthermore advantageous if the influences of the first and second transistors 3, 4 on the bus line voltage potential cancel each other out in that the first transistor drives with the same power at the high potential as the second transistor at the low potential.

Figure 2C:
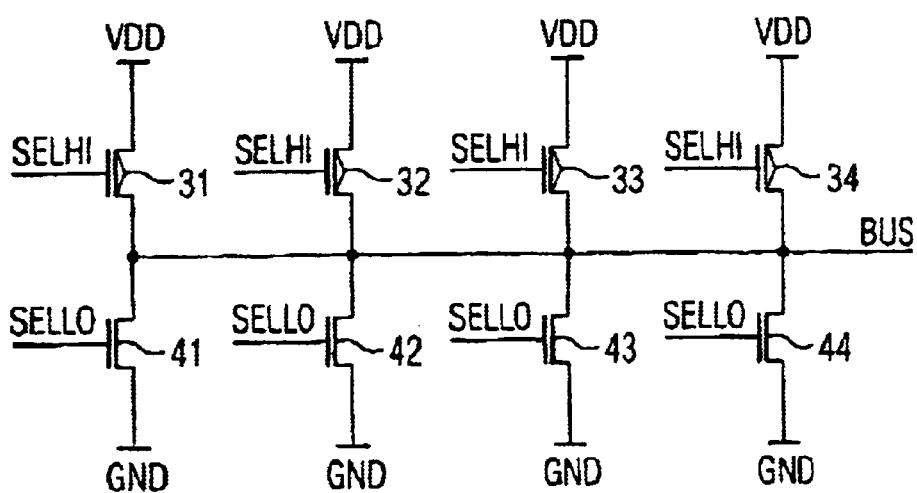
FIG. 2C is a circuit diagram of a driver stage whose driver power can be set by selection signals.

FIG. 2C shows a driver circuit whose driver power can be adapted to the requirements of the bus line BUS or the interfaces connected thereto. A plurality of first transistors 31, 32, 33, and 34 and a plurality of second transistors 41, 42, 43, 44 are provided for this purpose.

Depending on the required driver power, a number of the first transistors are through-connected in order to drive a high signal with the aid of first control signals SELHi0, SELHi1, SELHi2, SELHi3 and the second transistors 41, 42, 43, 44 remain fully deactivated. In order to drive a low signal onto the bus line BUS, a number of the second transistors 41, 42, 43, 44 are through-connected with the aid of second control signals SELLO0, SELLO1, SELLO2 and SELLO3, while the first transistors 31, 32, 33, 34 remain fully deactivated. The number of the first 31, 32, 33, 34 and second transistors 41, 42, 43, 44 used to drive a signal is determined by the required changeover speed between the high and low signals on the relevant bus line BUS and on the driver power required in order to drive a high or low level.

The circuit according to FIG. 2C with the plurality of first transistors 31, 32, 33, 34 and the plurality of second transistors 41, 42, 43, 44 is also suitable for adapting the terminating resistance to the characteristic impedance of the bus line BUS. The plurality of first transistors 31, 32, 33, 34 and the plurality of second transistors 41, 42, 43, 44 may be of different sizes, so that a suitable combination can be selected with the control signals SELHi0–SELHi3, SELLO0–SELLO3 present on the control inputs of the first transistors 31, 32, 33, 34 and the control inputs of the second transistors 41, 42, 43, 44 in order to obtain the required terminating resistance $R_{TT}$.

It is thus possible to adapt the driver power of the driver circuit 1 accurately with the plurality of first 31, 32, 33, 34 and the second transistors 41, 42, 43, 44, and also, in the passive driver circuit, to implement active termination of the relevant bus line BUS with no requirement for additional space in order to implement a termination.

Figure 3A:
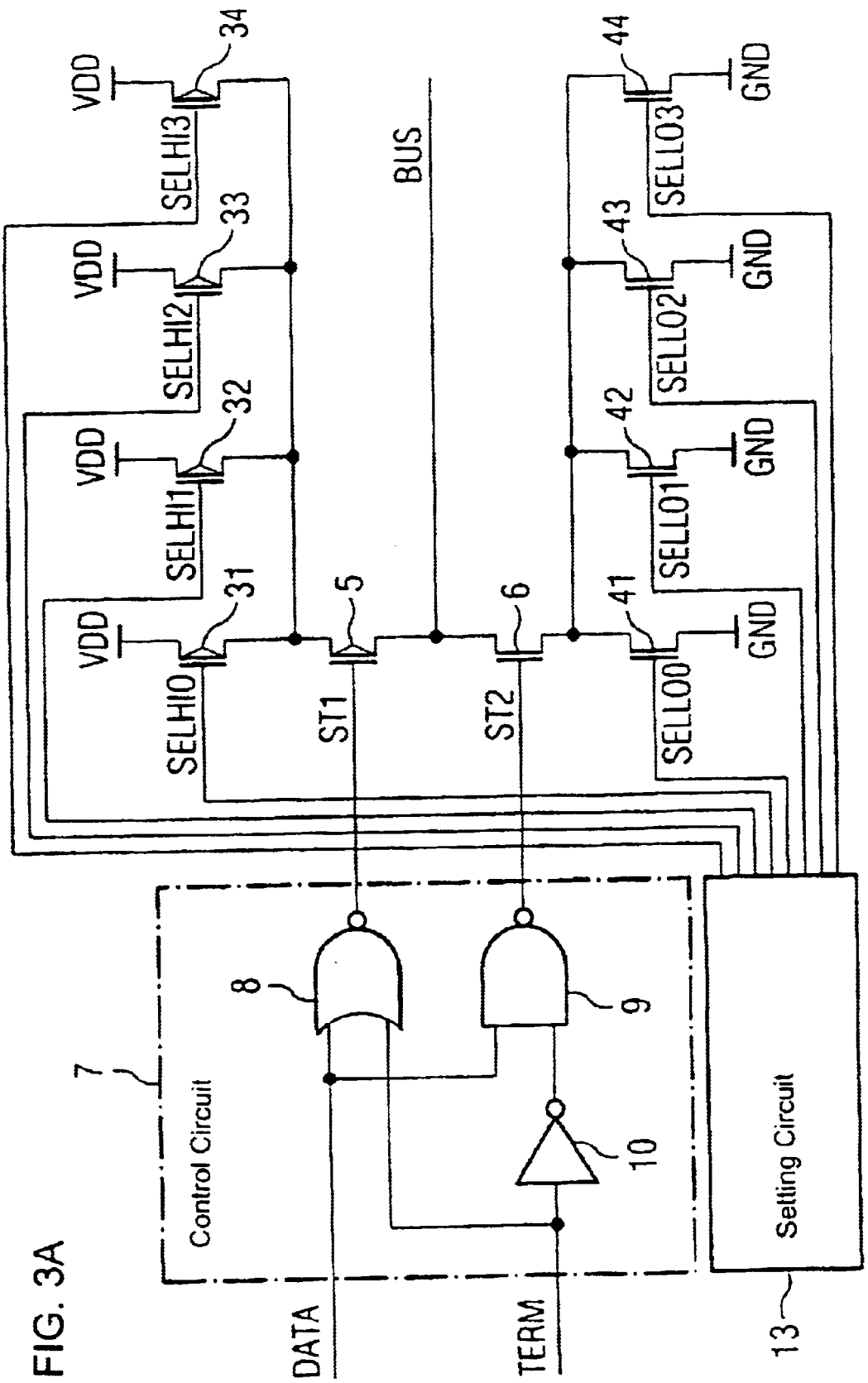
FIG. 3A is a circuit diagram of a first embodiment of a driver circuit according to the invention.

FIG. 3A shows an example of the driver circuit 1 with an associated control circuit 7, in which the driver power and the terminating resistance $R_{TT}$ can be accurately set according to the operating mode. As shown in FIG. 2C, a plurality of the first transistors 31, 32, 33, 34 are also provided here, the first terminals of which are connected to a first supply voltage potential VDD and the second terminals of which are connected to a first terminal of a third transistor 5. The second transistors 41, 42, 43, 44 are also provided, the first terminal of which is connected to a second supply voltage potential GND and the second terminals of which are connected to a first terminal of a fourth transistor 6. The second terminal of the third transistor 5 and the second terminal of the fourth transistor 6 are connected to one another and to the corresponding bus line BUS. The number of first 31, 32, 33, 34 and second transistors 41, 42, 43, 44 can be freely selected according to the required driver power.

The first transistors 31, 32, 33, 34 and the third transistor 5 are preferably of a first conductivity type, preferably of a p-conductivity type. The first transistors and the third transistor are preferably through-connected when a low signal is present on their control inputs. The second transistors 41, 42, 43, 44 and the fourth transistor 6 are preferably of a second conductivity type, preferably having an n-conductivity. The second transistors 41, 42, 43, 44 and the fourth transistor 6 are preferably through-connected when a high signal is present on their control inputs.

A first selection signal SELHi0, SELHi1, SELHi2, SELHi3 is in each case present on the control inputs of the first transistors 31, 32, 33, 34. A second selection signal SELLO0, SELLO1, SELLO2 and SELLO3 is in each case present on the control inputs of the second transistors 41, 42, 43, 44. The first and the second selection signals SELHi0–SELHi3, SELLO0–SELLO3 are provided by a setting circuit 13.

The selection signals SELHi0 to SELHi3, SELLO0 to SELLO3 serve to define the driver power of the driver circuit for driving a signal onto the bus line BUS, i.e. the more first transistors 31, 32, 33, 34 and the more second transistors 41, 42, 43, 44 selected, the greater the driver power of the driver circuit, since the respective forward resistance drops between the bus line BUS and the first or second supply voltage potential.

If no signal is transmitted, the driver circuit is switched to the passive mode, and a terminating resistance $R_{TT}$ is set. To do this, the first selection signals SELHi0 to SELHi3 and the second selection signals SELLO0 to SELLO3 are selected in such a way that the parallel connection of the forward resistances of the selected first transistors 31, 32, 33, 34 with the series-connected forward resistance of the third transistor 5 and the forward resistances of the selected second transistors 41, 42, 43, 44 with the series-connected forward resistance of the fourth transistor 6 produces the desired terminating resistance $R_{TT}$. The first selection signals SELHi0 to SELHi3 and the second selection signals SELLO0 to SELLO3 are selected here in such a way that the terminating resistance corresponds to the characteristic impedance of the signal line. The first and second selection signals SELHi0–SELHi3, SELLO0–SELLO3 are also preferably selected here via the setting circuit 13 in such a way that the voltage potential on the bus line BUS is only influenced by the activated transistors to a small extent.

When a signal is driven with the aid of the driver circuit in a first operating mode, either the third transistor 5 or the fourth transistor 6 is through-connected, so that either the first supply voltage potential VDD is applied to the bus line via the selected first transistors 31, 32, 33, 34 and the third transistor 5, or the second supply voltage potential GND is applied to the bus line via the second transistors 41, 42, 43, 44 and the fourth transistor 6.

If, in a second operating mode, no signals are driven onto the bus line BUS, the third transistor 5 and the fourth transistor 6 are through-connected and the first selection signals SELHi0 to SELHi3 and the second selection signals SELLO0 to SELLO3 are selected in such a way that the desired terminating resistance $R_{TT}$ is achieved in the entire circuit.

A control circuit 7 is used to provide a first control signal ST1 and a second control signal ST2. The control circuit 7 generates the first control signal ST1 and the second control signal ST2 in such a way that, in the first operating mode of the driver circuit, the first control signal ST1 and the second control signal ST2 are switched in such a way that either the third transistor 5 or the fourth transistor 6 is through-connected, whereby, depending on the data signal which is to be driven, either the first supply voltage potential VDD or the second supply voltage potential GND is applied to the bus line BUS or, in the second operating mode, the third transistor 5 and the fourth transistor 6 are through-connected.

The operating mode that specifies whether data are to be transmitted via the driver circuit, or whether the driver circuit is to be switched to the passive mode, is indicated by a termination control signal TERM on a first input of the control circuit 7. The control circuit 7 has a NOR circuit 8, a NAND circuit 9 and an inverter 10. The termination control signal TERM is applied to an input of the inverter 10. The control circuit 7 has a second input, on which a data signal DATA, which is to be driven onto the bus line BUS, is present. The data signal is connected in the control circuit 7 to a first input of the NOR circuit 8 and to a first input of the NAND circuit 9. A second input of the NOR circuit 8 is connected to the termination control signal TERM, and a second input of the NOR circuit 9 is connected to an output of the inverter 10, on which the inverted termination control signal TERM is present. The first control signal ST1 is output on an output of the NOR circuit 8 and the second control signal ST2 is output on an output of the NAND circuit 9.

If the termination control signal TERM is set to a logical "0", the first control signal ST1 and the second control signal ST2 correspond in each case to the inverted data signal. The inverted data signal is similarly inverted by the downstream driver circuit, so that the non-inverted data signal is driven onto the bus line. If a logical "1" is present on the control input of the third transistor 5, the latter will block. If a logical "1" is present on the control input of the fourth transistor 6, the latter will switch to the forward mode. Conversely, the third transistor 5 is switched to the forward mode if a logical "0" is present on its control input.

A series connection of the two transistors, as shown in FIG. 3A, produces a relatively high resistance for the first operating mode in which data are driven.

Figure 3B:
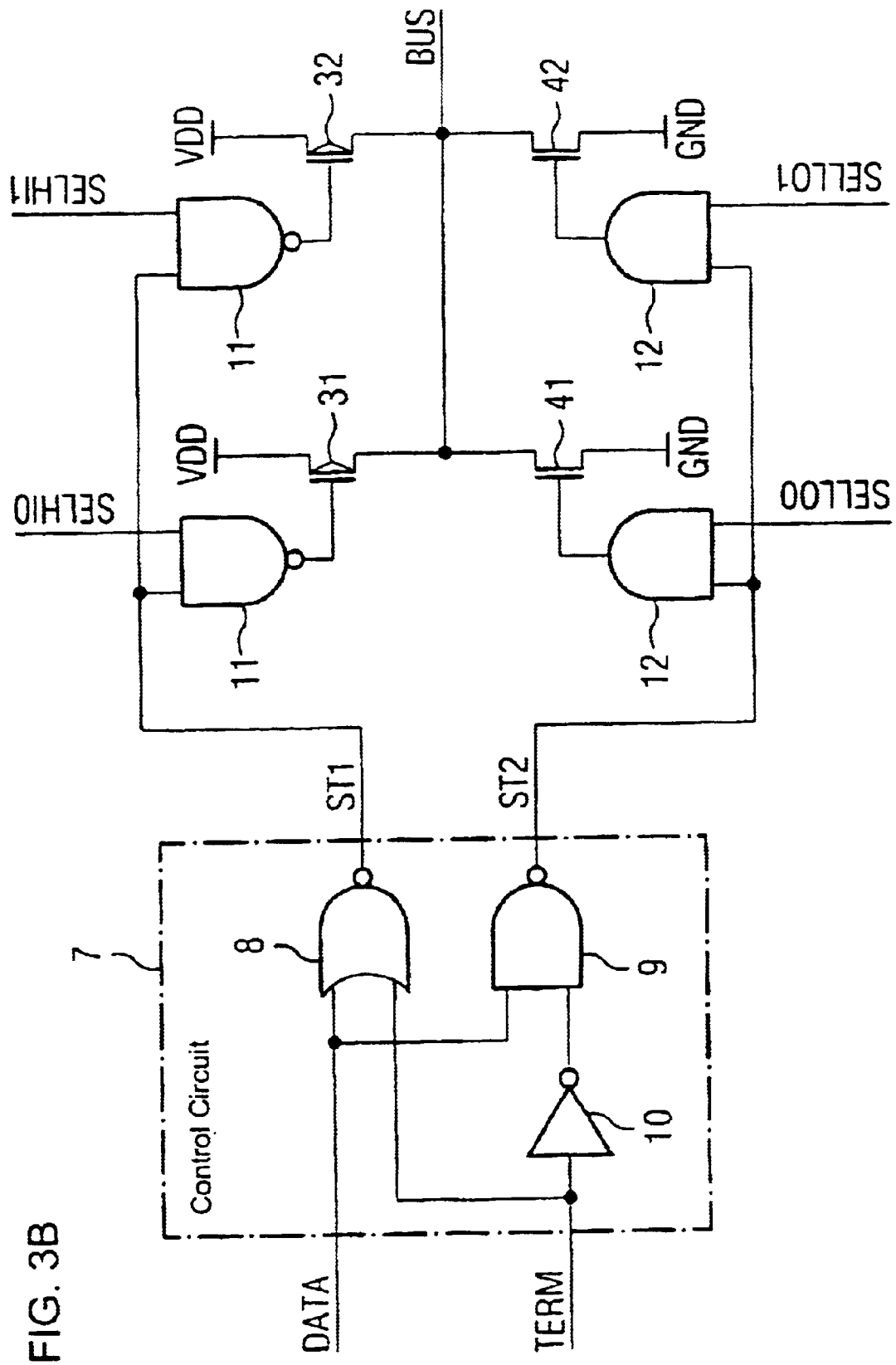
FIG. 3B is a circuit diagram of second embodiment of the driver circuit according to the invention.

A circuit according to FIG. 3B is proposed in order to avoid this. FIG. 3B shows the driver circuit with two first transistors 31, 32 and two second transistors 41, 42. Other numbers of first transistors and second transistors can of course also be selected. In the driver circuit, in contrast to the embodiment shown in FIG. 3A, the third and fourth transistors 5, 6 are excluded and the signal present on the control inputs of the first 31, 32 and the second transistors 41, 42 is formed instead from the first selection signals SELHi0, SELHi1 and second selection signals SELLO0, SELLO1, and from the first control signal ST1 and the second control signal ST2. Each control input of the first transistors 31, 32 is connected to an output of a NAND circuit 11 for this purpose.

The first inputs of the NAND circuits 11 which are connected to the first transistors 31, 32 are connected to the first control signal ST1. The first selection signal SELHi0, SELHi1 that is allocated to the respective first transistor 31, 32 is present in each case on a second input of the NAND circuits 11. The first control signal ST1 is thus through-connected to the control input of the first transistors 31, 32 only if the relevant first transistor 31, 32 is selected by the relevant selection signal SELHi0, SELHi1.

Each of the control inputs of the second transistors 41, 42 is connected to a further AND circuit 12. A first input of the further AND circuits 12 is connected in each case to the second control signal ST2, and the second selection signal SELLO0, SELLO1 which is allocated to the respective second transistor 41, 42 is present on the second inputs of the AND circuits 12. In this way, the second control signal ST2 is applied to the control inputs of the second transistors 41, 42 depending on the second selection signals SELLO0, SELLO1.

The circuits shown enable the use of an available driver circuit, which is switched to the passive state in a receive mode, to terminate the interfaces on bus lines. An additional space requirement in order to implement a termination in the electronic circuit can thereby be avoided. In addition, it is also possible to accurately set the terminating resistance by selection signals, particularly if the characteristic impedance of a signal line is variable.

The first and second selection signals SELHi0 to SELHi3, SELLO0 to SELLO3 may be different for the first drive operating mode and the second operating mode, in that the driver circuit is switched to passive, so that the optimum driver power and the optimum terminating resistance $R_{TT}$, or an optimum terminating voltage can be achieved with a minimal influence on the bus line potential.

The features of the invention disclosed in the preceding description, the claims and the drawings may be fundamental, both individually and in any given combination, to the implementation of the invention in its different designs.

We claim:
1. An electronic circuit, comprising:
   a first supply voltage terminal;
   a second supply voltage terminal;
   a driver circuit for driving a signal onto a signal line having a specific characteristic impedance, said driver circuit having a first switching device with a first forward resistance between said first supply voltage terminal end the signal line, and a second switching device with a second forward resistance between said second supply voltage terminal and the signal line;

said first switching device containing a plurality of parallel-connected first transistors having control inputs and a second transistor having a control input and being connected in series with said plurality of parallel-connected first transistors;

a control circuit connected to said driver circuit and generating a first control signal and a second control signal controlling said first switching device and said second switching device in a first operating mode such that, depending on the signal to be driven, either said first switching device or said second switching device being through-connected so that the signal will be driven onto the signal line, said control circuit activating said first switching device and said second switching device substantially simultaneously in a second operating mode with an aid of the first and second control signals so that said first and second forward resistances together form a terminating resistance; and said second switching device containing a plurality of parallel-connected third transistors having control inputs and a fourth transistor having a control input and being connected in series with said plurality of parallel-connected third transistors, said control input of said second transistor receiving the first control signal and said control input of said fourth transistor receiving the second control signal, said control inputs of said first transistors receiving first selection signals and said control inputs of said third transistors receiving second selection signals, the first forward resistance being set by forward resistances of said first transistors activated with an aid of the first selection signals and said second transistor, and the second forward resistance being set by forward resistances of said third transistors activated with an aid of the second selection signals and said fourth transistor.

2. The electronic circuit according to claim 1, wherein:

said first switching device has parallel-connected first switching elements each receiving the first control signal and first selection signals, and at least some of said first switching elements being activated by the first selection signals resulting in the first forward resistance being set by forward resistances of said first switching elements activated with an aid of the first selection signals; and said second switching device has parallel-connected second switching elements each receiving the second control signal and second selection signals, and at least some of said second switching elements being activated by the second selection signals resulting in the second forward resistance can be set by forward resistances of said second switching elements activated with an aid of the second selection signals.

3. The electronic circuit according to claim 2, wherein at least one of said first switching elements has a first transistor with a first control input and the first control signal is applied to said first control input of said first transistor depending on a corresponding one of the first selection signals, and at least one of said second switching elements has a second transistor with a second control input and the second control signal is applied to said second control input of said second transistor depending on a corresponding one of the second selection signals.

4. The electronic circuit according to claim 3, wherein said driver circuit includes:

a first RAND circuit connected to said first control input of said first transistor, said first NAND circuit having a first input receiving the first control signal and a second input receiving the corresponding one of the first selection signals; and a second AND circuit connected to said second control input of said second transistor, said second AND circuit having a first input receiving the second control signal and a second input receiving the corresponding one of the second selection signals.

5. The electronic circuit according to claim 3, wherein said first transistor is of a first conductivity type and said second transistor is of a second conductivity type.

6. The electronic circuit according to claim 2, wherein the first selection signals and the second selection signals are selected such that the terminating resistance corresponds to the specific characteristic impedance of the signal line.

7. The electronic circuit according to claim 2, wherein the first selection signals and the second selection signals are selected in order to define said first forward resistance of said first switching device and said second forward resistance of said second switching device such that the signal line has a predefined voltage level.

8. The electronic circuit according to claim 7, wherein the predefined voltage level lies roughly midway between a first voltage level on said first supply voltage terminal and a second voltage level on said second supply voltage terminal.

9. The electronic circuit according to claim 1, wherein:

said first switching device has a first switching element receiving the first control signal and a first selection signal, said first switching element being activated by the first selection signal resulting in the first forward resistance being set by a forward resistance of said first switching element activated with an aid of the first selection signal; and said second switching device has a second switching element receiving the second control signal and a second selection signal, and said second switching element being activated by the second selection signal resulting in the second forward resistance can be set by a forward resistance of said second switching element activated with an aid of the second selection signal.

10. An electronic circuit, comprising:

a first supply voltage terminal;

a second supply voltage terminal;

a driver circuit for driving a signal onto a signal line having a specific characteristic impedance, said driver circuit having a first switching device with a first forward resistance between said first supply voltage terminal and the signal line, and a second switching device with a second forward resistance between said second supply voltage terminal and the signal line;

said first switching device containing a plurality of parallel-connected first transistors having control inputs and a second transistor having a control input and being connected in series with said plurality of parallel-connected first transistors; and said second switching device containing a plurality of parallel-connected third transistors having control inputs and a fourth transistor having a control input and being connected in series with said plurality of parallel-connected third transistors, said control input of said second transistor receiving a first control signal and said control input of said fourth transistor receiving a second control signal, said control inputs of, said first transistors receiving first selection signals and said control inputs of said third transistors receiving second selection signals, the first forward resistance being set by forward resistances of said first transistors activated with an aid of the first selection signals and said second transistor, and the second forward resistance being set by forward resistances of said third transistors activated with an aid of the second selection signals and said fourth transistor.

11. The electronic circuit according to claim 10, wherein said first transistors are of a first conductivity type and said third transistors is of a second conductivity type.

12. An electronic circuit, comprising:

a first supply voltage terminal;

a second supply voltage terminal;

a driver circuit for driving a signal onto a signal line having a specific characteristic impedance, said driver circuit having a first switching device with a first forward resistance between said first supply voltage terminal and the signal line, and a second switching device with a second forward resistance between said second supply voltage terminal and the signal line;

a control circuit connected to said driver circuit and generating a first control signal and a second control signal controlling said first switching device and said second switching device in a first operating mode such that, depending on the signal to be driven, either said first switching device or said second switching device being through-connected so that the signal will be driven onto the signal line, said control circuit activating said first switching device and said second switching device substantially simultaneously in a second operating mode with an aid of the first and second control signals so that said first and second forward resistances together form a terminating resistance;

said control circuit having a data input for applying the signal and a termination control input for applying a termination control signal;

said control circuit having an inverter;

said control circuit having a NAND circuit with a first input, a second input, and an output and a NOR circuit with a first input, a second input, and an output, said inverter being connected to said second input of said NAND circuit, said first input of said NOR circuit receiving the signal and said second input of said NOR circuit receiving the termination control signal, said output of said NOR circuit supplying the first control signal, said first input of said NAND circuit receiving the signal and said second input of said NAND circuit receiving the termination control signal inverted via said inverter, said output of said NAND circuit providing the second control signal.

* * * * *